(12) United States Patent
Kakkad

(10) Patent No.: US 6,610,613 B2
(45) Date of Patent: Aug. 26, 2003

(54) METHOD FOR FABRICATING THIN INSULATING FILMS, A SEMICONDUCTOR DEVICE AND A METHOD FOR FABRICATING A SEMICONDUCTOR DEVICE

(75) Inventor: Ramesh H. Kakkad, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/794,132

(22) Filed: Feb. 28, 2001

(65) Prior Publication Data

US 2001/0046788 A1 Nov. 29, 2001

(30) Foreign Application Priority Data

Feb. 29, 2000 (JP) ........................................ 2000-053886

(51) Int. Cl.$^7$ ........................ H01L 21/31; H01L 21/469
(52) U.S. Cl. .................... 438/771; 438/769; 438/776
(58) Field of Search .............................. 438/787, 788, 438/791, 792, 771, 776, 769

(56) References Cited

U.S. PATENT DOCUMENTS

| 4,728,528 A | * | 3/1988 | Ishihara et al. ................ 427/39 |
| 5,403,630 A | * | 4/1995 | Matsui et al. ................ 427/583 |
| 6,287,988 B1 | * | 9/2001 | Nagamine et al. .......... 438/770 |

* cited by examiner

Primary Examiner—Alexander Ghyka
(74) Attorney, Agent, or Firm—Oliff & Berridge, PLC.

(57) ABSTRACT

The invention grows $SiO_2$ and silicon nitride films over silicon at temperatures in a range of room temperature to 700° C. The lower temperature oxidation is made possible by creation of reactive oxygen species and by supplying photon energy, ion energy or electron energy to a gas mixture containing noble gas(es) and oxidizing gas(es). It is also possible to fabricate silicon nitride films by supplying energy through photons, ions or electrons to a gas mixture containing noble gas(es) and nitridizing gas(es).

23 Claims, 1 Drawing Sheet

METHOD FOR FABRICATING THIN INSULATING FILMS, A SEMICONDUCTOR DEVICE AND A METHOD FOR FABRICATING A SEMICONDUCTOR DEVICE

BACKGROUND OF THE INVENTION

1. Field of Invention

The present invention relates to a method of fabricating insulating films for application in thin film transistors (TFTs) and metal insulator semiconductor (MIS) transistors.

2. Description of Related Art

Forming an insulating film, such as $SiO_2$, constitutes one of the significant steps in the manufacture of transistors, such as silicon MOSFET (Metal Oxide Semiconductor Field Effect Transistor). Formation of $SiO_2$ film on silicon is performed at temperatures that typically exceed 1000° C. in the presence of chemical species that oxidize the silicon. This process is known as thermal oxidation.

The thermal oxidation process is subject to undesirable side-effects, such as redistribution of the dopant profiles in the semiconductors, since significant diffusion of dopants occurs at the high temperatures that are effected in this process. An oxidation temperature that is below 700° C. is desirable to suppress these side-effects.

Thin film transistor (TFT) devices, which have a basic structure similar to that of a typical MOSFET, have been used for display applications, such as liquid crystal displays (LCD) and organic electroluminescence displays (OELD). Such devices require a $SiO_2$ layer to be formed at a temperature which is below 430° C., since these displays use optically transparent substrates, such as glass, which cannot withstand higher temperatures. For such TFT-applications, deposited $SiO_2$ films are currently used, which are of inferior quality and also form an inferior interface with silicon as compared to $SiO_2$ which is produced by oxidation of silicon; thereby adversely affecting the TFT performance. Thus, the oxidation process must be performed at temperatures that are as low as possible.

SUMMARY OF THE INVENTION

The object of the present invention is to provide an inexpensive and simple method for fabricating high quality insulating films at low temperatures.

In accordance with the invention, high quality $SiO_2$ films are fabricated on silicon by supplying photon energy to a mixture of noble gas and oxidizing gas (such as $O_2$, $H_2O$, $N_2O$) to create reactive oxygen, which reacts with silicon to form $SiO_2$.

The invention also covers a similar process that can also be used to form silicon nitride film by supplying photon energy to a mixture of noble gas and nitriding gas (such as $NH_3$, $N_2$ etc.).

These methods, wherein the energy is supplied to the gas mixtures using photons, are advantageous because they are simple and inexpensive. Instead of photon energy, other energy sources, such as ion beams or electron beams, can also be used.

DETAILED DESCRIPTION OF PREFERRED EMBODIMENTS

In order for oxide films to grow over silicon substrate, it is necessary that silicon react with oxygen or with the oxidizing agent that is used in the process. The molecular oxygen or $H_2O$, which is used in the thermal oxidation process, requires temperatures in the order of 1000° C. in order to grow oxide quickly enough to be practicable. On the other hand, the atomic oxygen readily reacts with silicon to form $SiO_2$ layer. Thus, a significant step in growing $SiO_2$ films at low temperatures is to create atomic oxygen at low temperatures.

In order to create atomic oxygen, a gas mixture of oxygen and noble gas (such as He, Ne, Ar, Kr, Xe) can be used. The noble gases can easily be excited to higher energy states by receiving energy from photons or from other energy sources. The energy level differences between the excited states and the ground states of these noble gases are higher than the energy level difference between the atomic oxygen and ground level of oxygen molecules.

For example, the first excited state level for helium is 19.8 eV higher than its ground state. For argon this value is 11.6 eV. The energy required to change grounded oxygen molecules into atomic state varies from 7 eV to 11.6 eV depending upon the orbital level configuration. Thus, by energy-transfer collision between the excited noble gas and grounded oxygen, energy-controlled atomic oxygen would be generated. The oxygen would react with silicon to form $SiO_2$ layer at low temperatures. In this process, other oxidizing agents, such as ozone, $H_2O$ or $N_2O$ can also be used instead of oxygen.

Figure 1:
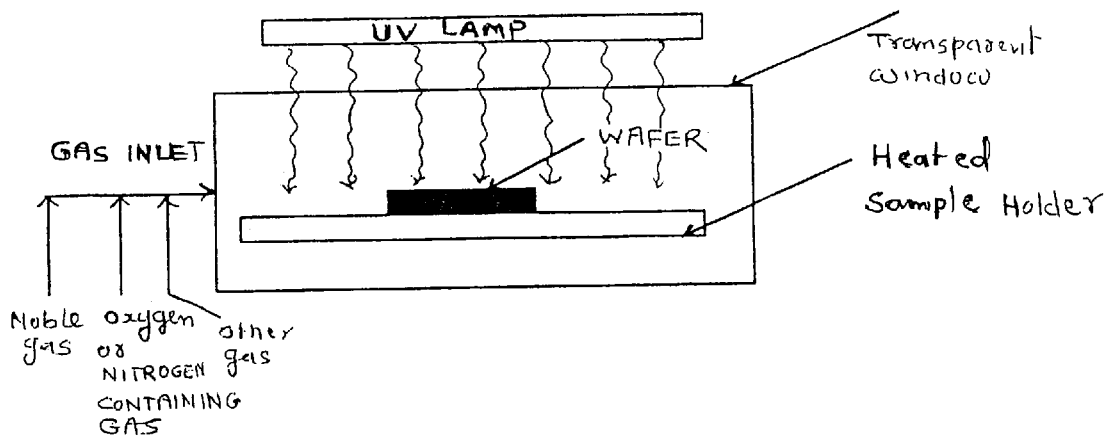
FIG. 1 is a schematic of an oxidation and nitridation process in accordance with the invention using a broad beam UV lamp.

The process is performed as shown in FIG. 1. A mixture of oxidizing gas(es) and noble gas(es) is introduced into a reaction chamber containing the silicon substrate. The substrate can be heated to a desired temperature by a heater. The photons are supplied from a lamp for a broad beam exposure, as shown in FIG. 1. The noble gas(es) are excited to higher energy levels by interaction with the photons. The excited noble gases in turn create reactive oxidizing species by energy-transfer collisions with grounded oxygen molecules. These oxidizing species subsequently react with silicon to form $SiO_2$. It was found experimentally that the wavelength of the photon had to be 200 nm or less to achieve an enhanced oxidation rate via this process.

The above process can be further refined by adding nitrogen-containing compounds to the gas mixture. The nitrogen incorporation in the oxide results in increased reliability of films. Additionally, halogen, such as F or Cl, can be added to the gas mixture, which is expected to improve the oxide quality and enhance the oxidation rate.

Figure 2:
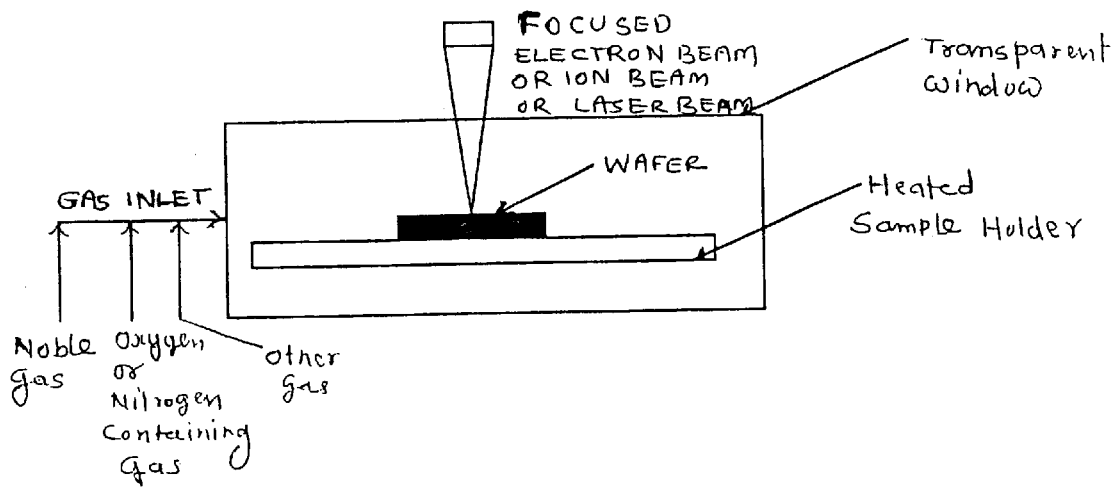
FIG. 2 is a schematic of an oxidation and nitridation process in accordance with the invention using a focused energy source, such as electron beams, ion beams or laser beams.

Instead of the broad-beam exposure to photons shown in FIG. 1, a focused beam can be used, as shown in FIG. 2. In this case, the energy can be supplied to the gas-mixture by photons, such as by a laser, an ion beam or an electron beam.

The above process discloses oxidation of silicon. However, it is also possible to perform nitridation of silicon using this process. The nitridation can be performed by flowing nitrogen containing compounds, such as $N_2$, NH3 etc., instead of oxygen containing compounds, along with noble gas(es), and supplying energy to create reactive species, which then react with silicon to form silicon nitride.

The insulating films produced by this process can be used in MIS type devices, such as MOS transistors, TFTs, and SOI (silicon on insulator) devices. The silicon oxide layer can be used as a gate insulator layer or a part of a gate insulator layer. The silicon nitride layer can also be used as a part of the gate insulator layer. Other applications of these films include use as interlayer dielectric layers in microelectronics devices.

What is claimed is:

1. A method for fabricating $SiO_2$ film, comprising:
   supplying photon energy to a mixture including at least one kind of noble gas and at least one kind of oxidizing gas to create reactive oxidizing species by causing energy transfer collisions between excited noble gas and grounded oxygen atoms; and
   reacting the reactive oxidizing species with a silicon part of a substrate to convert at least a portion of the silicon part into an $SiO_2$ film.

2. The method according to claim 1, wherein the at least one kind of noble gas is any one of helium, argon, neon, krypton, and xenon, or a mixture including at least two of helium, argon, neon, krypton and xenon.

3. The method according to claim 1, wherein the at least one kind oxidizing gas is any one of oxygen, Ozone, $H_2O$, and $N_2O$, or a mixture including at least two of oxygen, ozone, $H_2O$, and $N_2O$.

4. The method according to claim 1, wherein photons of the photon energy have a wavelength of 200 nanometers or less.

5. The method according to claim 1, wherein the temperature of the silicon to be oxidized is in a range of 20° C. to 700° C.

6. The method according to claim 1, wherein the gas mixture further includes at least one of nitrogen and a nitrogen containing compound.

7. The method according to claim 1, wherein the gas mixture further includes at least one of fluorine gas, chlorine gas and a halogen containing compound.

8. A semiconductor device incorporating the $SiO_2$ film fabricated according to the method of claim 1.

9. A method for fabricating $SiO_2$ film, comprising:
   supplying energy by an ion beam to a mixture including at least one kind of noble gas and at least one kind of oxidizing gas to create a reactive oxidizing species by causing energy transfer collisions between excited noble gas and grounded oxygen atoms; and
   reacting the reactive oxidizing species with a silicon part of a substrate to convert at least a part of the silicon part into an $SiO_2$ film.

10. A method for fabricating $SiO_2$ film, comprising:
    supplying energy by an electron beam to a gas mixture including at least one kind of noble gas and at least one kind of oxidizing gas to create a reactive oxidizing species by causing energy transfer collisions between excited noble gas and grounded oxygen atoms; and
    reacting the reactive oxidizing species with a silicon part of a substrate to convert at least a portion of the silicon part into a $SiO_2$ film.

11. A method for fabricating silicon nitride film, comprising:
    supplying photon energy to a mixture including at least one kind of noble gas and at least one kind of nitriding gas to create a reactive species by causing energy transfer collisions between excited noble gas and grounded nitrogen atoms; and
    reacting the reactive species with a silicon part of a substrate to convert at least a portion of the silicon part into a silicon nitride film.

12. The method according to claim 11, wherein the at least one kind of noble gas is any one of helium, argon, neon, krypton, and xenon, or a mixture including at least two of helium, argon, neon, krypton and xenon.

13. The method according to claim 11, wherein the at least one kind of nitriding gas is any one of oxygen, $N_2$, $NH_3$, and $N_2O$, or a mixture including at least two of $N_2$, $NH_3$, and $N_2O$.

14. The method according to claim 11, wherein photons of the photon energy have a wavelength of 200 nanometers or less.

15. The method according to claim 11, wherein the temperature of the silicon to be nitrided is in a range of 20° C. to 700° C.

16. The method according to claim 11, wherein the gas mixture further includes at least one of a halogen, including F and Cl, or a halogen containing compound.

17. A metal insulator semiconductor field effect transistor (MISFET) device incorporating the silicon nitride film fabricated according to the method of claim 11.

18. A method for fabricating silicon nitride film, comprising:
    supplying energy by an ion beam to a mixture including at least one kind of noble gas and at least one kind of nitriding gas to create a reactive species by causing energy transfer collisions between excited noble gas and grounded nitrogen atoms; and
    reacting the reactive oxidizing species with a silicon part of a substrate to convert at least a part of the silicon part.

19. A method for fabricating silicon nitride film, comprising:
    supplying energy by an ion beam to a mixture including at least one kind of noble gas and at least one kind of nitriding gas to create a reactive species by causing energy transfer collisions between excited noble gas and grounded nitrogen atoms; and
    reacting the reactive species with a silicon part of a substrate to convert at least a part of the silicon part into a silicon nitride film.

20. A method for fabricating a semiconductor device, comprising:
    supplying photon energy to a mixture including at least one kind of noble gas and at least one kind of oxidizing gas to create a reactive oxidizing species by causing energy transfer collisions between excited noble gas and grounded oxygen atoms; and
    reacting the reactive oxidizing species with a silicon part of a substrate to convert at least a portion of the silicon part into an $SiO_2$ film.

21. A thin film transistor (TFT) device incorporating the silicon nitride film fabricated according to the method of claim 11.

22. The method according to claim 20, wherein the $SiO_2$ film is formed as at least one of a gate insulator layer and a part of gate insulator layer of the semiconductor device.

23. A method for fabricating $SiO_2$ film, comprising:
    supplying photon energy to a mixture including at least one kind of noble gas and at least one kind of oxidizing gas to create a reactive oxidizing species, by causing energy transfer collisions between excited noble gas and grounded oxygen atoms, the mixture not containing silicon compound; and
    reacting the reactive oxidizing species with a silicon part of a substrate to convert at least a portion of the silicon part into $SiO_2$ film.

* * * * *